(12) United States Patent
Yokokawa et al.

(10) Patent No.: US 7,985,660 B2
(45) Date of Patent: Jul. 26, 2011

(54) METHOD FOR MANUFACTURING SOI WAFER

(75) Inventors: Isao Yokokawa, Annaka (JP); Hiroshi Takeno, Annaka (JP); Nobuhiko Noto, Annaka (JP)

(73) Assignee: Shin Etsu Handotai Co., Ltd., Tokyo (JP)

( * ) Notice: Subject to any disclaimer, the term of this patent is extended or adjusted under 35 U.S.C. 154(b) by 0 days.

(21) Appl. No.: 12/450,960

(22) PCT Filed: Apr. 16, 2008

(86) PCT No.: PCT/JP2008/000995
§ 371 (c)(1),
(2), (4) Date: Oct. 20, 2009

(87) PCT Pub. No.: WO2008/146441
PCT Pub. Date: Dec. 4, 2008

(65) Prior Publication Data
US 2010/0112781 A1      May 6, 2010

(30) Foreign Application Priority Data

May 22, 2007  (JP) .................................. 2007-135298

(51) Int. Cl.
*H01L 21/30* (2006.01)
*H01L 21/46* (2006.01)
(52) U.S. Cl. .......... 438/459; 257/E21.567; 257/E21.568
(58) Field of Classification Search .................. 438/455, 438/458, 459; 257/E21.568, E21.569
See application file for complete search history.

(56) References Cited

U.S. PATENT DOCUMENTS 5,834,363 A    11/1998 Masanori
(Continued)

FOREIGN PATENT DOCUMENTS

EP    0 697 713 A1    2/1996
(Continued)

OTHER PUBLICATIONS

Chinese Office Action issued in Patent Application No. 200880016916.9, dated Aug. 4, 2010 (with translation).

(Continued)

*Primary Examiner* — Matthew Smith
*Assistant Examiner* — CHristine Enad
(74) *Attorney, Agent, or Firm* — Oliff & Berridge, PLC (57) ABSTRACT

The present invention provides a method for manufacturing an SOI wafer, including: a step of preparing a base wafer consisting of a $p^+$ silicon single crystal wafer and a bond wafer consisting of a silicon single crystal wafer containing a dopant at a lower concentration than that in the base wafer; a step of forming a silicon oxide film on an entire surface of the base wafer based on thermal oxidation; a step of bonding the bond wafer to the base wafer through the silicon oxide film; and a step of reducing a thickness of the bond wafer to form an SOI layer, wherein a step of forming a CVD insulator film on a surface on an opposite side of a bonding surface of the base wafer is provided before the thermal oxidation step for the base wafer. As a result, it is possible to provide the method for manufacturing an SOI wafer which can easily prevent the p-type dopant contained in the base wafer from outwardly diffusing from the surface on the opposite side of the bonding surface of the base wafer due to a high-temperature heat treatment, suppress this dopant from being mixed into the SOI layer, and reduce warpage.

14 Claims, 3 Drawing Sheets

U.S. PATENT DOCUMENTS

| | | | |
|---|---|---|---|
| 6,008,110 A | 12/1999 | Samata et al. | |
| 2001/0046746 A1* | 11/2001 | Yokokawa et al. | 438/311 |
| 2003/0020096 A1* | 1/2003 | Akiyama et al. | 257/200 |
| 2007/0032043 A1* | 2/2007 | Endo et al. | 438/459 |
| 2008/0315349 A1 | 12/2008 | Takei et al. | |

FOREIGN PATENT DOCUMENTS

| | | |
|---|---|---|
| EP | 1 667 218 A1 | 6/2006 |
| JP | A 52-044169 | 4/1977 |
| JP | A 05-226620 | 9/1993 |
| JP | A 08-037286 | 2/1996 |
| JP | A 09-266175 | 10/1997 |
| JP | A 09-266214 | 10/1997 |
| JP | A 2001-044085 | 2/2001 |
| JP | A 2006-270039 | 10/2006 |
| WO | WO 2005/027217 A1 | 3/2005 |

OTHER PUBLICATIONS

Dec. 21, 2010 European Search Report issued in EP 08738597.7.

* cited by examiner

METHOD FOR MANUFACTURING SOI WAFER

TECHNICAL FIELD

The present invention relates to a method for manufacturing an SOI wafer, and more particularly to a method for manufacturing an SOI wafer by bonding a bond wafer consisting of a silicon single crystal wafer to a base wafer through an oxide film and then reducing a thickness of the bond wafer.

BACKGROUND ART

As one of semiconductor device wafers, there is an SOI (Silicon On Insulator) wafer having a silicon layer (which may be referred to as an SOI layer hereinafter) formed on a silicon oxide film as an insulator film. This SOI wafer has characteristics such as a small parasitic capacitance or a high radiation-proof capability since the SOI layer in a substrate surface layer portion that functions as a device fabrication region is electrically separated from the inside of the substrate by, e.g., a buried insulator layer (a buried oxide film layer (a BOX layer)). Therefore, effects such as a high-speed/low-power-consumption operation, prevention of a software error, and others can be expected, and this wafer appears promising as a substrate for a high-performance semiconductor device.

As a typical method for manufacturing this SOI wafer, there is a wafer bonding method or an SIMOX method. The wafer bonding method is a method of forming a thermal oxide film on, e.g., a surface of at least one of two silicon single crystal wafers, then closely attaching the two wafers to each other through the formed thermal oxide film, performing a bonding heat treatment to increase a bonding strength, and thereafter reducing a thickness of one wafer (a wafer to be a SOI layer (which will be referred to as a bond wafer)) by, e.g., mirror polishing, thereby manufacturing an SOI wafer. Further, as a method for reducing a thickness, there is, e.g., a method of grinding or polishing a bond wafer until a desired thickness is obtained, a method called an "ion implantation delamination method" of implanting at least either hydrogen ions or rare gas ions into a bond wafer to form an ion implanted layer and then delaminating the bond wafer in the ion implanted layer.

On the other hand, the SIMOX method is a method for manufacturing an SOI wafer by ion-implanting oxygen into a single-crystal silicon substrate, then performing a high-temperature heat treatment (an oxide film forming heat treatment), and reacting the implanted oxygen and silicon to form a BOX layer.

Of the two typical techniques, the wafer bonding method has the superiority that a thickness of the SOI layer or the BOX layer can be freely set, and hence this method can be applied to various device applications.

Among others, since the ion implantation delamination method can greatly improve the film thickness uniformity of the SOI layer to be fabricated, this method has been actively used in recent years.

On the other hand, to suppress warpage of an SOI wafer or improve a gettering capability, using a base wafer having boron doped at a high concentration to manufacture the SOI wafer has been often performed as described in Japanese Patent Application Laid-open No. 1993-226620 or Japanese Patent Application Laid-open No. 1996-37286.

When applying such a base wafer having boron doped at a high concentration to the ion implantation delamination method, a structure having a very thick buried insulator layer having a thickness of, e.g., 2 µm or above or 10 µm or above formed therein may be demanded. In such a case, when a thick oxide film is formed on a bond wafer to be bonded, there arises a problem that ion implantation energy must be extremely increased or warpage of an SOI wafer to be fabricated increases, and hence a thick oxide film must be formed on a base wafer side to be bonded to the bond wafer.

At this time, since the base wafer having boron doped at a high concentration is thermally oxidized to form the thick oxide film, a large amount of boron is contained in the thermal oxide film, and there occurs a problem that boron contained in a thermal oxide film on a back surface side of the SOI wafer outwardly diffuses to contaminate the SOI layer with a dopant when performing a bonding heat treatment, a flattening heat treatment, or a high-temperature heat treatment such as epitaxial growth with respect to the SOI wafer after delamination. When such auto-doping occurs, a conductivity type or a resistivity of the SOI layer changes.

The same problem occurs due to a heat treatment that performs epitaxial growth on an SOI layer after reducing a film thickness and thereby increases a film thickness of the SOI layer or a heat treatment during a device manufacturing process using an SOI wafer even though any other film thickness reducing technique such as grinding or polishing is used.

DISCLOSURE OF INVENTION

In view of the above-described problems, it is an object of the present invention to provide a method for manufacturing an SOI wafer that can readily prevent a p-type dopant contained in a base wafer from outwardly diffusing from a surface of the base wafer on an opposite side of a bonding surface, suppress mixing of the dopant into an SOI layer, and reduce warpage of an SOI wafer in an SOI wafer manufacturing process or a device manufacturing process using the SOI wafer when manufacturing the SOI wafer by forming a thermal oxide film on the base wafer.

To achieve this object, the present invention provides a method for manufacturing an SOI wafer, comprising at least: a step of preparing a base wafer consisting of a $p^+$ silicon single crystal wafer containing a p-type dopant in the entire wafer at a high concentration and a bond wafer consisting of a silicon single crystal wafer containing a dopant at a lower concentration than that of the p-type dopant in the base wafer; a step of forming a silicon oxide film on the entire surface of the base wafer based on thermal oxidation; a step of bonding the bond wafer to the base wafer through the silicon oxide film on the base wafer; and a step of reducing a thickness of the bond wafer to form an SOI layer, wherein a step of forming a CVD insulator film on a surface on an opposite side of a bonding surface of the base wafer is provided before the thermal oxidation step for the base wafer.

As explained above, the method for manufacturing an SOI wafer according to the present invention has the base wafer and the bond wafer preparation step, the base wafer thermal oxidation step, the wafer bonding step, and the bond wafer thickness reducing step, and has the step of forming the CVD insulator film on the surface of the base wafer on the opposite side of the bonding surface of the base wafer before the base wafer thermal oxidation step.

Since the $p^+$-type silicon single crystal wafer having a high p-type dopant concentration is used as the base wafer and the silicon thermal oxide film is formed on the entire surface of the base wafer based on such a method, the SOI wafer having less warpage and a high gettering capability can be manufactured. Further, since the CVD insulator film having no dopant diffused therein is formed on the opposite surface of the bonding surface of the base wafer before the base wafer thermal oxidation step, the CVD insulator film can prevent the p-type dopant taken into the silicon thermal oxide film on the back surface side of the base wafer from outwardly diffusing from the back surface of the SOI wafer even if a heat treatment during the SOI wafer manufacturing process after the bonding step or a high-temperature heat treatment during the device manufacturing process using the SOI wafer is carried out.

Furthermore, since the base wafer thermal oxidation treatment is performed after forming the CVD insulator film, thermal oxidation advances on the interface of the CVD insulator film and the base wafer, and hence the CVD insulator film that is not contaminated with the dopant remains on the opposite surface of the bonding surface of the base wafer by depositing the CVD insulator film with an appropriate film thickness, thereby suppressing the auto-doping that occurs at the time of epitaxial growth.

As a result, since the p-type dopant can be suppressed from being mixed into the SOI layer even in the device manufacturing process including the many heat treatment steps, a conductivity type or a resistivity of the SOI layer can be prevented from fluctuating.

Moreover, according to the present invention, scratches on the bonding surface of the base wafer formed by a susceptor of a CVD furnace at the time of forming the CVD insulator film or the CVD insulator film that has reached the bonding surface side of the base wafer can be readily removed by performing the CVD insulator film forming step before the base wafer thermal oxidation step in particular, thereby obtaining a mirror surface.

Additionally, since a thermal oxidation temperature of the base wafer is higher than a CVD insulator film forming temperature, forming the CVD insulator film before the base wafer thermal oxidation step enables increasing a density of the CVD insulator film during the thermal oxidation for the base wafer, thus assuring the outward diffusion preventing effect.

In this case, it is preferable that a step of forming a silicon oxide film on the entire surface of the bond wafer is provided before the bonding step.

Forming the silicon oxide film on the entire surface of the bond wafer before the bonding step is preferable for device characteristics since the bonding interface is not exposed on the SOI layer side.

In particular, when the thickness of the bond wafer is reduced by the ion implantation delamination method, channeling of the bond wafer at the time of ion implantation can be avoided.

Additionally, according to the present invention, it is preferable that at least either hydrogen ions or rare gas ions are implanted into the bond wafer to form an ion implanted layer and the thickness of the bond wafer is reduced by delaminating the bond wafer at the ion implanted layer before the bonding step.

In the method for manufacturing an SOI wafer according to the present invention, when the thickness of the bond wafer is reduced by such a so-called ion implantation delamination method, since the film thickness uniformity of the SOI layer is high and the CVD insulator film forming step is carried out before the base wafer thermal oxidation step, the susceptor of the CVD furnace does not damage the surface of the SOI layer after reducing the thickness of the bond wafer, and unintended delamination does not occur in the bond wafer before the thickness reducing step. Therefore, when the CVD insulator film forming step is carried out before the base wafer thermal oxidation step and the thickness of the bond base is reduced based on ion implantation delamination, the SOI wafer having the high film thickness uniformity of the SOI layer and the excellent outward diffusion preventing effect can be manufactured.

Additionally, it is preferable that the CVD insulator film is any one of a CVD oxide film, a CVD nitride film, and a CVD oxynitride film.

As explained above, when the CVD insulator film is one of the CVD oxide film, the CVD nitride film, and the CVD oxynitride film, the dense CVD insulator film can be formed by the simple method, thereby more effectively avoiding auto-doping of the p-type dopant taken into the silicon thermal oxide film on the base wafer with respect to the SOI layer after the bonding step.

Further, it is preferable to set a p-type dopant concentration in the base wafer to $5 \times 10^{17}$ atoms/cm$^3$ or above.

Even if the concentration of the p-type dopant in the base wafer is set to $5 \times 10^{17}$ atoms/cm$^3$ or above, the p-type dopant can be effectively prevented from being outwardly diffused, and auto-doping with respect to the SOI layer can be reduced. Further, when such a P-type dopant concentration in the base wafer is set, the SOI wafer having a high gettering capability can be provided.

Furthermore, epitaxial growth can be carried out on the SOI layer to increase a thickness of the SOI layer after the thickness reducing step.

Even if the epitaxial growth is carried out on the SOI layer after the thickness reducing step to increase the thickness of the SOI layer in this manner, the CVD insulator film can sufficiently prevent the p-type dopant contained in the base wafer from outwardly diffusing from the opposite surface of the bonding surface of the base wafer with respect to the long high-temperature heat treatment at the time of the epitaxial growth, thus suppressing a change in resistivity caused due to the auto-doping in the epitaxial layer.

The method for manufacturing an SOI wafer according to the present invention can prevent the p-type dopant contained in the base wafer from outwardly diffusing from the opposite surface of the bonding surface of the base wafer during the SOI wafer manufacturing process or the device manufacturing process using the SOI wafer when the thermal oxide film is formed on the based wafer having a low resistivity to manufacture the SOI wafer, and the auto-doping into the SOI layer can be suppressed, and the warpage of the SOI wafer can be reduced.

BEST MODE(S) FOR CARRYING OUT THE INVENTION

As explained above, to improve a gettering capability of an SOI wafer that is manufactured by a bonding method, a base wafer having boron as a p-type dopant doped at a high concentration is currently often used to manufacture the SOI wafer. However, when a p$^+$ base wafer is used to fabricate an SOI wafer and then epitaxial growth is carried out on a thin SOI layer of this SOI wafer, there arises a problem that boron contained in the base wafer outwardly diffuses from a back surface (a surface on which epitaxial growth is not carried out) of the SOI wafer at the time of growth, the SOI layer is subjected to auto-doping, and a conductivity type or a resistivity of the SOI layer thereby changes.

On the other hand, when fabricating an SOI wafer having a very thick buried insulator layer having a thickness of, e.g., 2 μm or above or 10 μm or above, an entire surface of a base wafer rather than a bond wafer is thermally oxidized to form a thick thermal oxide film while considering warpage of the SOI wafer to be fabricated. However, even in such a case, the thick thermal oxide film formed on the p$^+$ base wafer contains a large amount of boron, boron eventually outwardly diffuses from a back surface of the SOI wafer during a heat treatment for epitaxial growth or a high-temperature heat treatment in a device manufacturing process.

The present inventors have keenly and repeatedly conducted studies to solve such a problem.

As a result, they have conceived that a CVD insulator film can be formed on an opposite surface of a bonding surface of a base wafer before a base wafer thermal oxidation step as a method for manufacturing an SOI wafer that can readily prevent a p-type dopant in the base wafer from outwardly diffusing from the opposite surface of the bonding surface of the base wafer during a high-temperature heat treatment after bonding and can reduce warpage of the SOI wafer when forming a thermal oxide film on the base wafer to manufacture the SOI wafer, and they have brought the present invention to completion. That is, since the thermal oxidation advances on an interface of the CVD insulator film and the base wafer when the base wafer is thermally oxidized after forming a CVD insulator film, the CVD insulator film that is not contaminated with the dopant remains on the opposite surface of the bonding surface of the base wafer by depositing the CVD insulator film with an appropriate film thickness, thereby suppressing auto-doping that occurs at the time of epitaxial growth.

An embodiment according to the present invention will now be described hereinafter with reference to the accompanying drawings, but the present invention is not restricted thereto.

As a first embodiment of a method for manufacturing an SOI wafer according to the present invention, a case that a thickness of a bond wafer is reduced by, e.g., grinding/polishing or etching will be first explained. It is to be noted that a case that a thickness of the bond wafer is reduced by an ion implantation delamination method will be explained later in a second embodiment.

Figure 1:
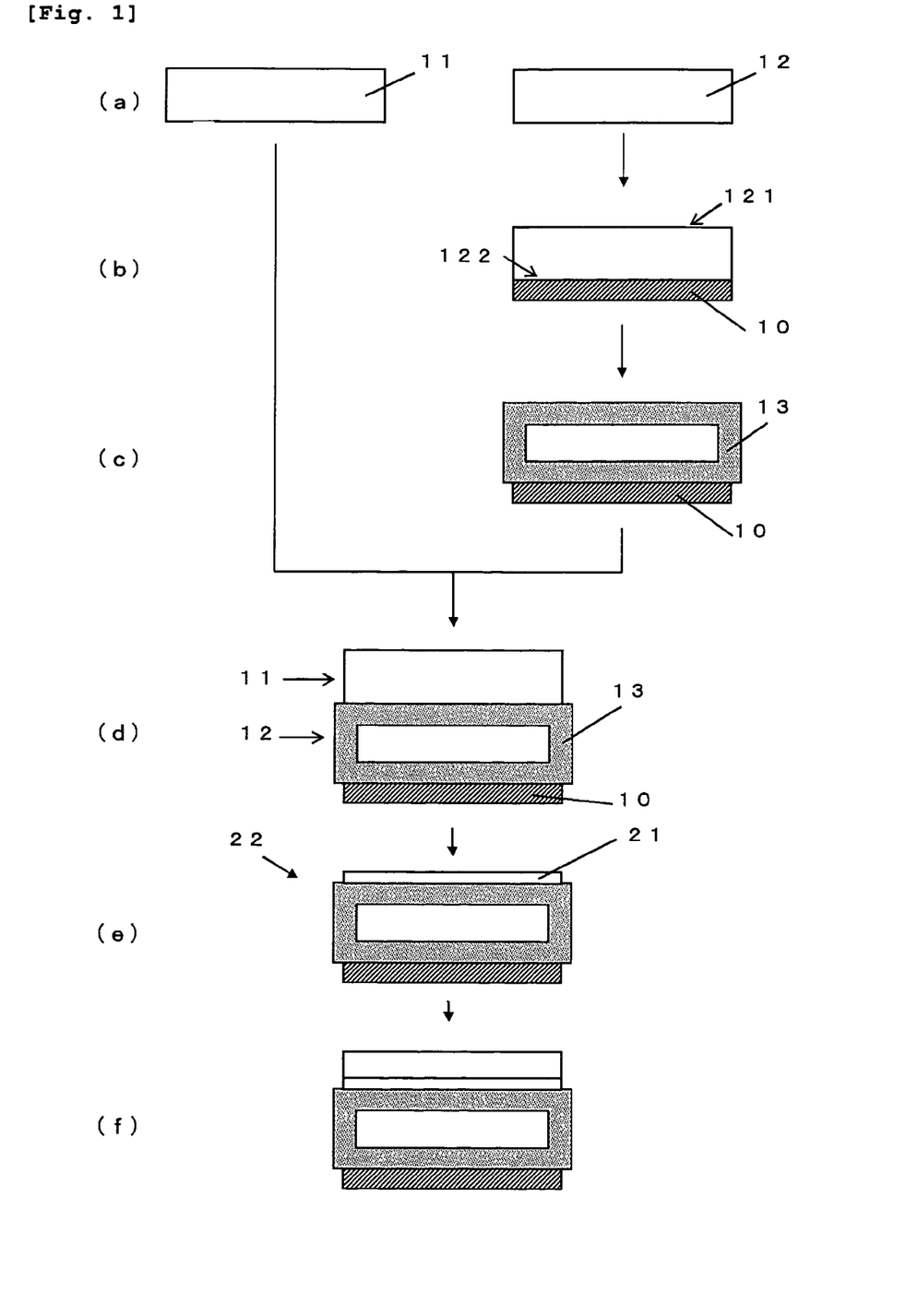
FIG. 1 is a view showing a flowchart of a first embodiment in a method for manufacturing an SOI wafer according to the present invention.

FIG. 1 is a view showing a flowchart of a first embodiment of the method for manufacturing an SOI wafer according to the present invention.

A bond wafer 11 and a base wafer 12 are first prepared (a step a).

At this time, the base wafer 12 is a p$^+$ silicon single crystal wafer containing a p-type dopant at a high concentration in the entire wafer, and the bond wafer 11 is a silicon single crystal wafer containing a dopant at a lower concentration than the p-type dopant in the base wafer 12.

Here, the "high concentration" of the p-type dopant in the base wafer 12 means a higher concentration than the concentration of the dopant in the bond wafer 11, and a specific numeric value is not restricted in particular, but setting $5 \times 10^{17}$ atoms/cm$^3$ or above is desirable. A type of the p-type dopant in the base wafer 12 is not restricted in particular as long as it is usually utilized, but boron or the like can be preferably used. It is to be noted that, when the concentration of the p-type dopant is $5 \times 10^{17}$ atoms/cm$^3$ or above, a resistivity becomes a low resistivity that is approximately 0.1 Ωcm or below. When the p-type dopant concentration in the base wafer 12 is high, strength of the base wafer 12 can be increased, and the gettering capability can be also improved.

Further, either an n type or a p type can be used as a conductivity type of the bond wafer 11, and a dopant type is not restricted in particular and can be appropriately selected in accordance with a purpose.

A CVD insulator film 10 is formed on a surface 122 on an opposite side of a bonding surface 121 of the base wafer 12 before a thermal oxidation step for the base wafer (a step b).

In regard to formation of this CVD insulator film 10, for example, the base wafer 12 is mounted on a susceptor (not shown) in a CVD furnace with the bonding surface 121 thereof facing downward, and the CVD insulator film 10 can be deposited on the surface 122 on the opposite side by a CVD method (Chemical Vapor Deposition).

At this time, the bonding surface 121 of the base wafer 12 may be measurably damaged when this wafer is mounted on the susceptor (not shown), or the CVD insulator film may reach the bonding surface 121 side to be formed thereon. When the bonding surface 121 of the base wafer has damages or extension of the CVD insulator film in this manner, a bonding failure may occur after bonding the base wafer to the bond wafer.

Therefore, when the bonding surface 121 of the base wafer has the damages or extension of the CVD insulator film, the bonding surface 121 of the base wafer 12 can be easily mirror-finished by performing mechano-chemical polishing (CMP) after forming the CVD insulator film in order to remove these damages or the extended CVD insulator film.

As characteristics of the present invention, the CVD insulator film is formed on the base wafer before the thermal oxidation step for the base wafer because of these damages or the extended insulator film.

That is, when the CVD insulator film is formed after a silicon oxide film is formed on the base wafer, the above-explained damages or extension of CVD insulator film is formed on the surface of the silicon oxide film when forming the CVD insulator film even though a surface of the base wafer subjected to double-side mirror polishing or single-side mirror polishing is used as the bonding surface.

Since mirror polishing for removal of the damages or extension of the CVD insulator film formed on this silicon oxide film is difficult, forming the CVD insulator film on the base wafer before the thermal oxidation step for the base wafer as explained above enables readily mirror-finishing the bonding surface 121 of the base wafer.

Moreover, when the bonding surface 121 of the base wafer 12 is subjected to mirror polishing after the CVD insulator film is formed, a polishing state of the base wafer to be used can be appropriately selected in expectation of this polishing treatment.

That is, when the base wafer subjected to double-side mirror polishing is used, mirror polishing can be again performed with respect to the bonding surface 121 of the base wafer 12 after the CVD insulator film is formed.

When the base wafer that is not subjected to double-side mirror polishing is used, the bonding surface 121 of the base wafer 12 can be mirror-polished at this step after the CVD insulator film is formed.

Therefore, in the present invention, the polishing state of the base wafer 12 can be appropriately selected as required.

Additionally, as the CVD insulator film 10 formed on the surface 122 on the opposite side of the bonding surface of the base wafer, using any one of a CVD oxide film, a CVD nitride film, and a CVD oxynitride film is preferable.

Since using any one of the CVD oxide film, the CVD nitride film, and the CVD oxynitride film as the CVD insulator film enables forming the dense CVD insulator film by the simple method, auto-doping with respect to the bond wafer (an SOI layer) caused due to the p-type dopant taken into a silicon oxide film on the base wafer after the bonding step can be very effectively avoided at a low cost.

Then, a silicon oxide film 13 is formed on an entire surface of the base wafer 12 based on thermal oxidation (a step c).

In the thermal oxidation of the base wafer at this step c, the thermal oxidation advances on not only the surface of the base wafer 12 where the CVD insulator film 10 is not formed but also an interface of the base wafer 12 where the CVD insulator film 10 is formed. Therefore, even if the CVD insulator film 10 is formed before the thermal oxidation step, a silicon thermal oxide film 13 is formed on the entire surface of the base wafer 12 as shown in FIG. 1. That is, when the thermal oxidation of the base wafer is carried out after the CVD insulator film is formed, the thermal oxidation advances on the interface of the CVD insulator film and the base wafer, and hence depositing the CVD insulator film with an appropriate film thickness allows the CVD insulator film that is not contaminated with the dopant to remain on the surface of the base wafer on the opposite side of the bonding surface, thereby suppressing the auto-doping that occurs at the time of epitaxial growth.

Furthermore, at this thermal oxidation step, the p-type dopant contained in the base wafer 12 is taken into the silicon oxide film 13. However, the CVD insulator film 10 that is not contaminated with the p-type dopant remains on the outermost surface on the opposite side of the bonding side of the base wafer 12. Therefore, the CVD insulator film 10 that is not contaminated with the p-type dopant can prevent the p-type dopant taken into the silicon oxide film 13 on the back surface side of the base wafer from outwardly diffusing from a back surface of an SOI wafer even during a heat treatment in an SOI wafer manufacturing process after the bonding step or a high-temperature heat treatment in a device manufacturing process using an SOI wafer. As a result, since the p-type dopant can be suppressed from being mixed into the SOI layer even during the device manufacturing process having many heat treatment steps, a fluctuation in conductivity type or resistivity of the SOI layer can be suppressed.

Furthermore, the CVD insulator film 10 formed at the step b is heated at the thermal oxidation step as the step c. Since a thermal oxidation temperature of this base wafer 12 (e.g., approximately 1200° C.) is higher than a formation temperature of the CVD insulator film 10 (e.g., approximately 600° C.), a density of the CVD insulator film 10 can be increased during the thermal oxidation of the base wafer 12 by forming the CVD insulator film 10 before the thermal oxidation step for the base wafer 12, thereby densifying this film. Therefore, an outward diffusion preventing effect can be assured. Moreover, a film thickness of the CVD insulator film 10 is reduced when the CVD insulator film 10 becomes dense.

It is to be noted that a thermal oxidation method for the base wafer at the step c is not restricted in particular, and there is, e.g., wet oxidation.

Then, the bond wafer 11 is bonded to the surface of the base wafer 12 having no CVD insulator film 10 formed thereon through the silicon oxide film 13 formed on the base wafer 12 (a step d).

As to this bonding step, for example, when one main surface of the bond wafer 11 is brought into contact with that of the base wafer 12 in a clean atmosphere at an ordinary temperature, the wafers can be bonded to each other without using, e.g., an adhesive.

Since bonding at an ordinary temperature alone cannot provide sufficient bonding strength and the wafers cannot be directly used in the device manufacturing process, the bonded wafers are usually subjected to a high-temperature heat treatment as a bonding heat treatment to obtain sufficient bonding strength. For example, this heat treatment can be performed in an inert gas atmosphere or an oxidizing gas atmosphere at 1000° C. to 1250° C. for 30 minutes to 4 hours.

Subsequently, a thickness of the bond wafer 11 is reduced to form an SOI layer 21 (a step e). This reduction in thickness of the bond wafer 11 can be carried out by a regular method such as grinding, polishing, or etching. With this processing, an SOI wafer 22 having the CVD insulator film 10 that can avoid outward diffusion on a back surface thereof can be manufactured.

Additionally, when increasing a thickness of the SOI layer 21 is desirable, after this thickness reducing step (the step e), epitaxial growth can be carried out on the SOI layer 21 (a step f).

As explained above, even when the epitaxial growth is carried out on the SOI layer to increase the thickness of the SOI layer after the thickness reducing step, the CVD insulator film 10 can sufficiently prevent the p-type dopant contained in the base wafer from outwardly diffusing from the surface on the opposite side of the bonding surface of the base wafer with respect to the long high-temperature heat treatment at the time of the epitaxial growth, thus suppressing a change in resistivity caused due to the auto-doping in the epitaxial layer.

It is to be noted that forming the silicon oxide film on the entire bond wafer 11 before the step of bonding the base wafer 12 to the bond wafer 11 (the step d) is preferable in the present invention.

When the silicon oxide film is formed on the entire surface of the bond wafer 11 before the bonding step in this manner, since the bonding interface does not appear on the SOI layer side, it is possible to suppress an interface state from occurring in the SOI layer or contamination from occurring, which is preferable for device characteristics.

This silicon oxide film forming step for the bond wafer may be carried out at any timing between the step a and the step d.

As explained above, according to the SOI wafer manufactured in the first embodiment of the present invention, since the CVD insulator film 10 is already formed on the surface 122 on the opposite side of the bonding surface of the base wafer before the bonding step, warpage of the wafer occurs as a convex shape on the side where the CVD insulator film is formed, but a force that causes the convex shape acts on the side where the bond wafer is bonded when the bond wafer is bonded, and hence warpage is reduced in the entire finished SOI wafer.

Therefore, using a structure consisting of the $p^+$ silicon single crystal wafer containing the p-type dopant at a high concentration in the entire wafer as the base wafer and forming the CVD insulator film on the surface on the opposite side of the bonding surface of the base wafer enable manufacturing the SOI wafer having less warpage as compared with an SOI wafer having no CVD insulator film formed thereon.

As a second embodiment according to the present invention, a case where a thickness of a bond wafer is reduced by the ion implantation delamination method will now be described hereinafter with reference to FIG. 2.

Figure 2:
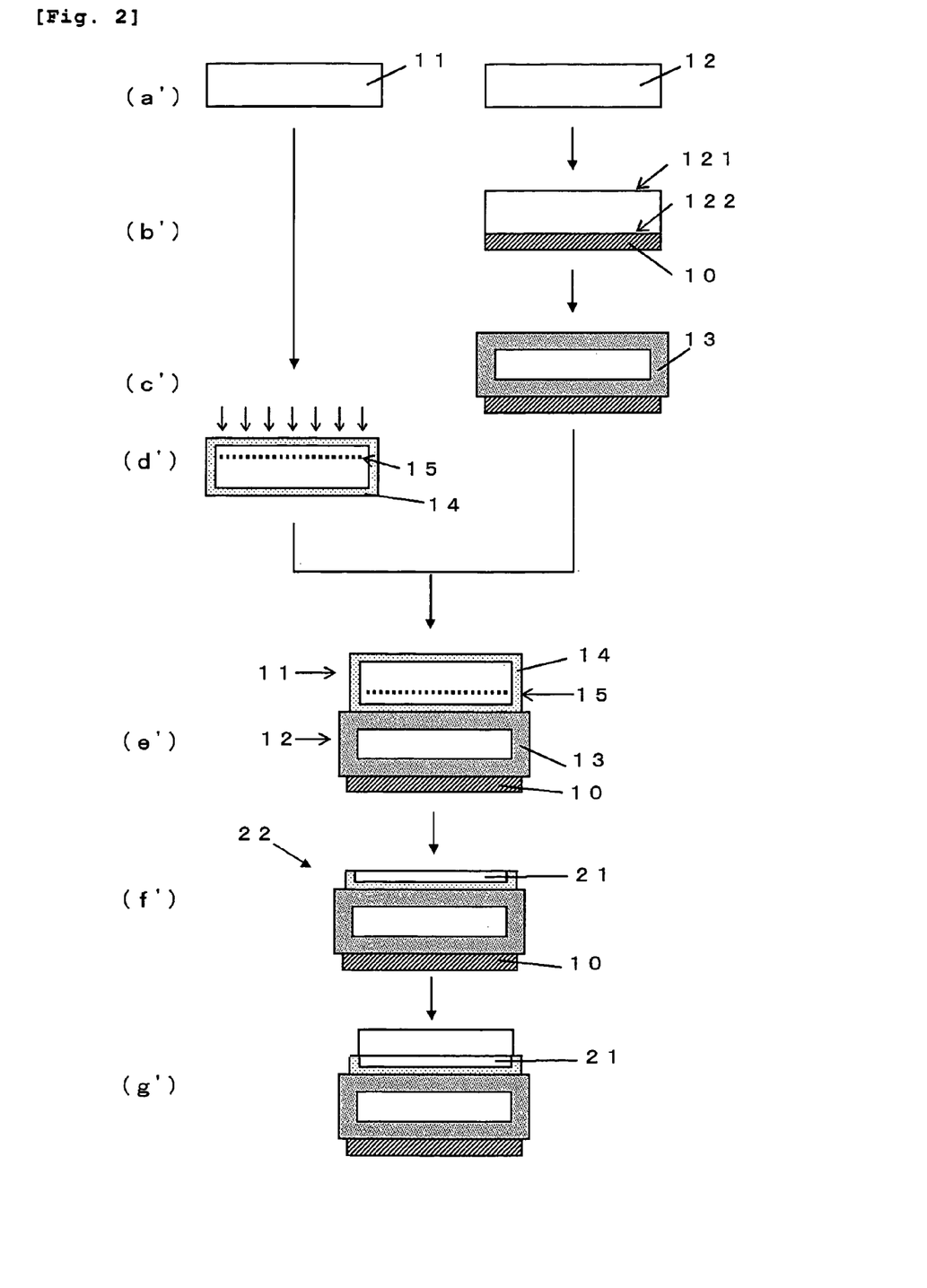
FIG. 2 is a view showing a flowchart of a second embodiment in the method for manufacturing an SOI wafer according to the present invention.

FIG. 2 is a view showing a flowchart of the second embodiment of a method for manufacturing an SOI wafer according to the present invention. It is to be noted that like reference numerals denote parts equal to those in FIG. 1, thereby omitting an explanation thereof.

First, at a step a', a bond wafer 11 and a base wafer 12 are prepared (equal to the step a). Then, at a step b', a CVD insulator film 10 is formed on a surface 122 on an opposite side of a bonding surface 121 of the base wafer 12 before a thermal oxidation step (a step c') for the base wafer 12 (equal to the step b). Subsequently, at the step c', a silicon oxide film 13 is formed on an entire surface of the base wafer 12 by thermal oxidation (equal to the step c).

On the other hand, at least either hydrogen ions or rare gas ions are implanted into the bond wafer 11 to form an ion implanted layer 15 (a step d').

A depth of the ion implanted layer 15 at this moment is reflected in a thickness of an SOT layer 21 that, is finally formed. Therefore, performing the ion implantation while controlling, e.g., implantation energy enables controlling the thickness of the SOI layer.

At the time of this ion implantation, channeling may become a problem, but this problem can be sidestepped by performing the implantation in a direction avoiding axial channeling or planar channeling or by adjusting a crystal orientation.

However, forming a silicon oxide film 14 on an entire surface of the bond wafer 11 before forming the ion implanted layer 15 enables further avoiding the channeling caused due to the ion implantation.

In this case, however, the ion implanted layer 15 must be formed at a position deeper than at least the silicon oxide film 14 at the step d'. Therefore, the implantation energy and a dose amount at the time of ion implantation can be appropriately selected depending on a film thickness of the silicon oxide film 14 of the bond wafer 11.

It is to be noted that the step d' that is carried out with respect to the bond wafer 11 may be effected at any timing between the step b' and the step c', which are carried out with respect to the base wafer 12, or it may be effected collaterally.

Then, the bond wafer 11 is bonded to the base wafer 12 through the silicon oxide film 13 on the base wafer 12 and the silicon oxide film 14 on the bond wafer (a step e'). At this time, the bonding surface of the bond wafer 11 is determined as the surface subjected to the ion implantation at the step d'.

Like FIG. 1 mentioned above, when one main surface of the bond wafer 11 is brought into contact with that of the base wafer 12 in a clean atmosphere at an ordinary temperature, the wafers are bonded to each other without using, e.g., an adhesive.

Then, the bond wafer 11 is delaminated at the ion implanted layer 15 to reduce a thickness of the bond wafer 11, thereby forming an SOI layer 21 (a step f').

For example, when a heat treatment is performed with respect to the bonded wafers in an inert gas atmosphere such as Ar at a temperature of 500° C. or above for 30 minutes or above, the bond wafer 11 can be delaminated at the ion implanted layer 15 based on crystal reorientation and agglomeration of air bubbles.

Here, a bonding heat treatment that increases a bonding strength for the SOI layer 21 and the base wafer 12 may be carried out. For example, this bonding heat treatment can be performed in an inert gas atmosphere or a gas atmosphere having a slight oxidation atmosphere at 1000° C. to 1250° C. for 30 minutes to 4 hours.

Additionally, when increasing a thickness of the SOI layer 21 is desired with respect to the obtained SOI wafer as explained in the first embodiment, epitaxial growth can be effected on the SOI layer 21 (a step g') after this thickness reducing step (the step f').

When the thickness of the SOI layer is increased, since the thickness of the bond wafer is reduced based on the ion implantation delamination method, the SOI layer has the high film thickness uniformity, and the epitaxial growth is performed, whereby an epitaxial layer having a stable crystal orientation can be formed, and the CVD insulator film 10 can sufficiently prevent the p-type dopant from outwardly diffusing with respect to the long high-temperature heat treatment at the time of the epitaxial growth.

Further, in case of the second embodiment that the thickness is reduced based on the ion implantation delamination method, characteristics of the present invention exercise effects in particular. That is, the present invention is characterized in that the CVD insulator film is formed on the surface on the opposite side of the bonding surface of the base wafer before the thermal oxidation step for the base wafer.

When the CVD insulator film is formed after the silicon oxide film is formed on the base wafer, mirror-finishing the silicon oxide film is difficult as explained in the first embodiment.

Furthermore, when the CVD insulator film is formed on the base wafer after the wafer bonding step, unintended delamination may possibly occur on an interface of the ion implanted layer formed in the bond wafer due to heating.

Moreover, when the CVD insulator film is formed on the base wafer after the thickness reducing step for the bond wafer, in the event of occurrence of damages due to a susceptor in a CVD furnace or extension of the CVD insulator film, a surface of the SOI layer must be polished to remove these damages or the extended CVD insulator film, whereby the excellent film thickness uniformity obtained by forming the SOI layer based on the ion implantation delamination method is collapsed.

Therefore, when reducing the thickness of the bond wafer based on the ion implantation delamination method in particular, forming the CVD insulator film 10 on the surface on the opposite side of the bonding surface of the base wafer before the thermal oxidation step of the base wafer 12 enables easily preventing the dopant from outwardly diffusing from a back surface of the SOI wafer while maintaining the film thickness uniformity of the SOI layer obtained by the ion implantation delamination method, thus manufacturing the SOI wafer having a high gettering capability with less warpage.

The present invention will now be more specifically explained with reference to examples and comparative examples of the present invention, but the present invention is not restricted thereto.

Examples 1 to 4, Comparative Examples 1 and 2

An SOI wafer 22 was manufactured in a flow depicted in FIG. 2. Table 1 shows main manufacturing conditions and a result at that time, which are explained below.

TABLE 1

| | Example 1 | Example 2 | Example 3 | Example 4 | Comparative Example 1 | Comparative Example 2 |
|---|---|---|---|---|---|---|
| Bond wafer | Diameter 200 mm, n type (phosphorous-doped), 10 Ωcm (Dopant concentration 5E14/cm³) | | | | | |
| Base wafer | Diameter 200 mm, p type (boron-doped), 0.017 Ωcm (Dopant concentration 6E18/cm³) | | | | | |
| Thickness of CVD oxide film on back surface of base wafer (nm) | 100 | 200 | 300 | 500 | None | None |
| Thickness of thermal oxide film on base side (nm) | | | | 2000 | | |
| Thickness of thermal oxide film on bond side (nm) | | 100 | | | | 100 |
| Hydrogen ion implantation conditions | Implantation energy: 50 KeV, Dose amount: 5E16/cm² | | | | | |
| Delamination heat treatment | Argon atmosphere, 500° C., 30 minutes | | | | | |
| Sacrificial oxidation treatment (removal of damages) | (Oxidation): 900° C., One hour, Wet oxidation / (Removal of oxide film): 5% HF aqueous solution | | | | | |
| Flattening heat treatment | colspan: 100% Ar atmosphere, 1200° C., One hour, | | | | | |
| Formation of epitaxial layer | None | None | Raw material gas: TCS/H₂ Growth temperature: 1130° C. Epitaxial layer: n type, 5 Ωcm, 3 μm | | None | Same conditions as those in Examples 3 and 4 |
| Measurement of boron concentration in SOI layer (SIMS) | <1E13/cm³ | <1E13/cm³ | <1E13/cm³ | <1E13/cm³ | Maximum concentration >1E16/cm³ | Maximum concentration >1E14/cm³ |

<Step a'> First, an n-type silicon single crystal wafer that has a diameter of 200 mm and phosphorous doped therein was prepared as a bond wafer 11, and a p⁺ silicon single crystal wafer that has a diameter of 200 mm and boron doped therein ($6 \times 10^{18}$ atoms/cm³) and is of p-type was prepared as a base wafer 12 (Examples 1 to 4, Comparative Examples 1 and 2).

<Step b'> Then, the base wafer 12 was mounted on a susceptor of a CVD furnace with its bonding surface 121 facing downward, and a CVD oxide film as a CVD insulator film 10 was formed on a surface 122 on an opposite side of the bonding surface 121 based on the CVD method. A thickness of the CVD oxide film to be formed was 100 nm in Example 1, 200 nm in Example 2, 300 nm in Example 3, and 500 nm in Example 4. It is to be noted that the CVD insulator film was not formed in Comparative Examples 1 and 2.

<Step c'> Subsequently, a silicon oxide film 13 was formed on an entire surface of the base wafer 12 by thermal oxidation so as to obtain a film thickness of 2000 nm in both Examples and Comparative Examples.

<Calculation (Simulation) of Boron Concentration Distribution in Depth Direction>

Figure 3:
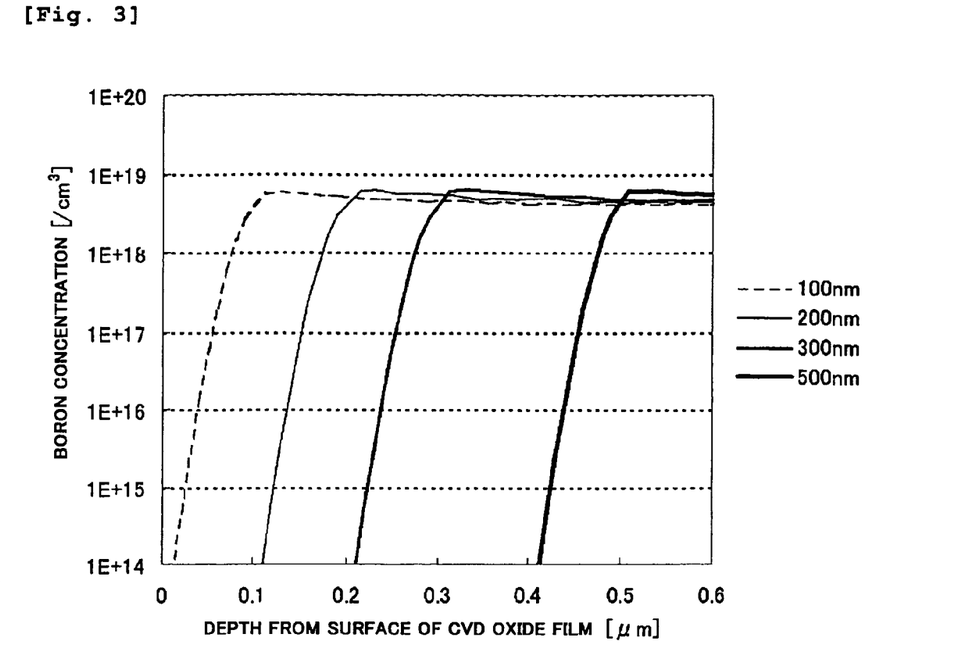
FIG. 3 is a view showing a relationship between a boron concentration and a depth from a CVD oxide film surface.

Here, a boron concentration distribution of the base wafer fabricated by the same method as explained above in a depth direction from a surface of the CVD oxide film was calculated in each of Examples 1 to 4. FIG. 3 shows a result. FIG. 3 is a view showing a relationship between a boron concentration and a depth from the CVD oxide film surface.

Referring to FIG. 3, in the base wafer having the CVD oxide film with a thickness of, e.g., 100 nm formed thereon, the boron concentration is gradually increased to approximately 0 to 0.1 μm, and the boron concentration is fixed at approximately $6 \times 10^{18}$/cm³ at a position deeper than approximately 0.1 μm where the silicon oxide film formed by thermal oxidation appears.

As a result, since the silicon oxide film 13 formed by the thermal oxidation is contaminated with boron at substantially the same concentration as that of the base wafer 12 whereas the boron concentration in the CVD oxide film 10 is reduced as getting close to a shallower position, it can be understood that dopant (boron) contamination is suppressed near the surface of the CVD oxide film 10.

Figure 4:
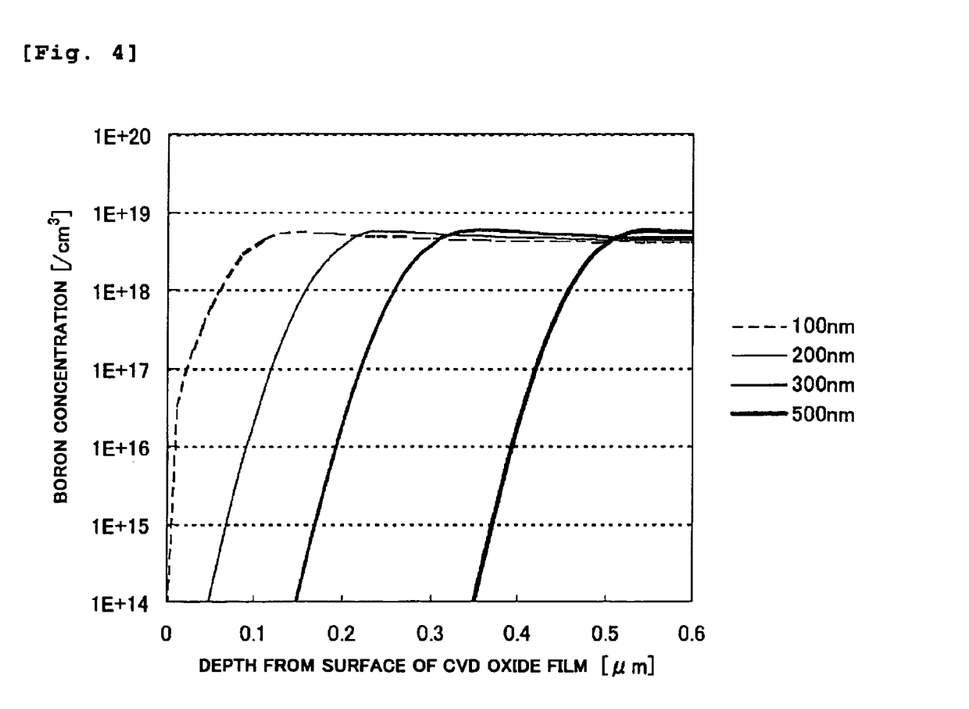
FIG. 4 is a view showing a relationship between a boron concentration and a depth from a CVD oxide film surface.

Further, a boron concentration distribution from the CVD oxide film surface subjected to a simulative device heat treatment (a heat treatment simulating a heat treatment performed in a regular device fabrication process: in a non-oxidizing atmosphere at 1200° C. for 4 hours) in a depth direction was calculated with respect to the base wafer according to each of Examples 1 to 4 after the thermal oxidation step. FIG. 4 shows a result. FIG. 4 is a view showing a relationship between a boron concentration and a depth from the CVD oxide film surface.

Referring to FIG. 4, the boron concentration near the surface of the base wafer having the CVD oxide film with a thickness of, e.g., 100 nm formed thereon is approximately $1 \times 10^{14}$/cm³, and it can be understood that boron contamination can be substantially suppressed near the outermost surface of the CVD oxide film in the base wafer having the CVD oxide film with a larger thickness formed thereon.

<Step d'> Subsequently, in both Examples and Comparative Examples, the bond wafer 11 was thermally oxidized to form a silicon oxide film 14 having a thickness of 100 nm, and then hydrogen ions were implanted into the bonding surface side under the conditions in Table 1, thereby forming an ion implanted layer 15.

<Step e'> Further, the bond wafer 11 subjected to the step d' was bonded to the base wafer 12 subjected to the step c' through the respective silicon oxide films 13 and 14. At this time, the surface of the base wafer 12 on the opposite side of the surface where the CVD oxide film 10 was formed was determined as the bonding surface, and the bond wafer 11 was bonded with the ion implanted layer 15 being set on the bonding surface side.

<Step f'> The bonded wafers were subjected to a delamination heat treatment in an argon atmosphere at 500° C. for 30 minutes, and the bond wafer 11 was delaminated at the ion implanted layer 15 to reduce its thickness, thereby forming an SOI layer 21. Subsequently, a sacrificial oxidation treatment was carried out under the conditions depicted in Table 1 to eliminate damages on the SOI layer. This sacrificial oxidation treatment also functions as a bonding heat treatment that strengthens bonding between the wafers. Furthermore, a flattening heat treatment was performed to manufacture an SOI wafer 22.

<Step g'> Epitaxial growth was carried out on the SOI layer 21 of the SOI wafer according to each of Examples 3 and 4 and Comparative Example 2 under the conditions depicted in Table 1.

<Measurement of Dopant Contamination in SOI Layer>

A boron concentration in the SOI layer of the thus manufactured SOI wafer according to each of Examples 1 and 2, Comparative Example 1 (without the epitaxial growth), Examples 3 and 4, and Comparative Example 2 (with the epitaxial growth) is measured by using an SIMS (a secondary ion mass spectroscopy apparatus). Its result is shown at the bottom of Table 1.

The boron concentration in the SOI layer according to Examples is approximately $1\times10^{13}/cm^3$ or below and, on the other hand, in Comparative Examples, the boron concentration in the SOI layer that was subjected to the epitaxial growth in Comparative Example 2 is higher than $1\times10^{14}/cm^3$, and the boron concentration in Comparative Example 1 that was not subjected to the epitaxial growth is higher than $1\times10^{16}/cm^3$.

Based on this measurement result, it can be understood that Examples that the CVD insulator film was formed before the thermal oxidation step can avoid outward diffusion of boron and suppress auto-doping of a dopant into the SOI layer as compared with Comparative Examples.

It is to be noted that the present invention is not restricted to the foregoing embodiments. The foregoing embodiments are just exemplifications, and any examples that have substantially the same structures and demonstrate substantially the same functions and effects as the technical concept described in claims of the present invention are included in the technical scope of the present invention.

The invention claimed is:

1. A method for manufacturing an SOI wafer, comprising at least:
    a step of preparing a base wafer consisting of a $p^+$ silicon single crystal wafer containing a p-type dopant in the entire wafer at a high concentration and a bond wafer consisting of a silicon single crystal wafer containing a dopant at a lower concentration than that of the p-type dopant in the base wafer;
    a step of forming a silicon oxide film on the entire surface of the base wafer based on thermal oxidation;
    a step of bonding the bond wafer to the base wafer through the silicon oxide film on the base wafer; and
    a step of reducing a thickness of the bond wafer to form an SOI layer,
    wherein a step of forming a CVD insulator film on a back surface of the base wafer on an opposite side of a bonding surface of the base wafer is provided before the thermal oxidation step for the base wafer.

2. The method for manufacturing an SOI wafer according to claim 1, wherein a step of forming a silicon oxide film on the entire surface of the bond wafer is provided before the bonding step.

3. The method for manufacturing an SOI wafer according to claim 2, wherein at least either hydrogen ions or rare gas ions are implanted into the bond wafer to form an ion implanted layer and the thickness of the bond wafer is reduced by delaminating the bond wafer at the ion implanted layer before the bonding step.

4. The method for manufacturing an SOI wafer according to claim 3, wherein the CVD insulator film is any one of a CVD oxide film, a CVD nitride film, and a CVD oxynitride film.

5. The method for manufacturing an SOI wafer according to claim 4, wherein a p-type dopant concentration in the base wafer is set to $5\times10^{17}$ atoms/cm$^3$ or above.

6. The method for manufacturing an SOI wafer according to claim 5, wherein epitaxial growth is carried out on the SOI layer to increase a thickness of the SOI layer after the thickness reducing step.

7. The method for manufacturing an SOI wafer according to claim 2, wherein the CVD insulator film is any one of a CVD oxide film, a CVD nitride film, and a CVD oxynitride film.

8. The method for manufacturing an SOI wafer according to claim 2, wherein a p-type dopant concentration in the base wafer is set to $5\times10^{17}$ atoms/cm$^3$ or above.

9. The method for manufacturing an SOI wafer according to claim 2, wherein epitaxial growth is carried out on the SOI layer to increase a thickness of the SOI layer after the thickness reducing step.

10. The method for manufacturing an SOI wafer according to claim 1, wherein at least either hydrogen ions or rare gas ions are implanted into the bond wafer to form an ion implanted layer and the thickness of the bond wafer is reduced by delaminating the bond wafer at the ion implanted layer before the bonding step.

11. The method for manufacturing an SOI wafer according to claim 10, wherein the CVD insulator film is any one of a CVD oxide film, a CVD nitride film, and a CVD oxynitride film.

12. The method for manufacturing an SOI wafer according to claim 1, wherein the CVD insulator film is any one of a CVD oxide film, a CVD nitride film, and a CVD oxynitride film.

13. The method for manufacturing an SOI wafer according to claim 1, wherein a p-type dopant concentration in the base wafer is set to $5\times10^{17}$ atoms/cm$^3$ or above.

14. The method for manufacturing an SOI wafer according to claim 1, wherein epitaxial growth is carried out on the SOI layer to increase a thickness of the SOI layer after the thickness reducing step.

* * * * *